United States Patent [19]
Johnston et al.

[11] Patent Number: 5,663,655
[45] Date of Patent: Sep. 2, 1997

[54] ESD PROTECTION FOR UNIVERSAL GRID TYPE TEST FIXTURES

[75] Inventors: Charles J. Johnston, Walnut; Mark A. Swart, Upland; Patrick R. Gocha, Anaheim Hills, all of Calif.

[73] Assignee: Everett Charles Technologies, Inc., Pomona, Calif.

[21] Appl. No.: 532,400

[22] Filed: Sep. 22, 1995

[51] Int. Cl.$^6$ .................................................. G01R 1/073
[52] U.S. Cl. .......................... 324/761; 324/110; 324/754
[58] Field of Search ................................ 324/761, 754, 324/158.1, 110, 72, 72.5

[56] References Cited

U.S. PATENT DOCUMENTS 5,315,252  5/1994  Puetz et al. .......................... 324/402

*Primary Examiner*—Ernest F. Karlsen
*Attorney, Agent, or Firm*—Christie, Parker & Hale, LLP

[57] ABSTRACT

A test fixture provides ESD protection to electronic switching circuitry in a universal grid type fixture having test probes arranged for electrical contact with a printed circuit board under test and in which test signals are sent between the circuit board and a high speed electronic test analyzer through intervening switching circuits. The test fixture includes a movable probe plate, a test probe mounted in the probe plate, the test probe including a movable plunger for making electrical contact with a printed circuit board during a test cycle, the plunger being movable between a first position and a second position, and a ground plane on the movable probe plate connected to electrical ground, the probe plunger having a ground plane contact element that contacts the ground plane in said first position of the plunger and which moves out of the contact with the ground plane when the plunger moves to the second position. The probe plate, is moved to a pre-test position in which the plunger is in the first position and in an electrical contact with the circuit board so that electrostatic charges on the board are dissipated to electrical ground through the ground plane via contact between the ground plane contact element of the plunger and the ground plane. The probe plate is moved to a test position after a preset time delay in which the plunger is compressed under a test force that moves the plunger to the second position out of contact with the ground plane to electrically isolate the plunger for conducting the test after electrostatic charges have been dissipated.

6 Claims, 5 Drawing Sheets

ESD PROTECTION FOR UNIVERSAL GRID TYPE TEST FIXTURES

FIELD OF THE INVENTION

The present invention is related to test fixtures for use in computerized automatic test equipment for checking printed circuit boards, and more particularly, to a fixturing system which is a specially adapted to prevent damage to the tester electronics caused by electrostatic charges developed between a board under test and the tester circuitry during a test operation.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and the corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

It is commonly known that electrostatic discharges (ESD) can cause serious damage to semi-conductor devices. In recent years it has been learned that circuits are exposed to potentially damaging electrostatic charges in the course of being checked on automatic test equipment. Electrostatic charges can build up on a printed circuit board as it is being moved from one location to another due to, for example, the triboelectric effect, or if static charges build up from handling the board prior to its being tested. Also, during testing it is common for vacuum to be used to exert the force on the UUT to engage it against the bed of nails, in which case air rushes through the test fixture during application of the vacuum as well as when the vacuum is released. The friction of air particles moving against the fixture surfaces and across the board is a source of electrostatic charge build up.

Several approaches have been used in the past in an attempt to deal with the electrostatic charges that develop in a test fixture during use. One such approach is described in U.S. Pat. No. 4,814,698 to St. Onge, et al. uses an anti-static substance having a certain critical resistivity applied to areas of a vacuum test fixture. Such vacuum test fixtures are in a class of test fixtures often referred to as customized or wired test fixtures in which the test probes are individually wired to separate interface contacts for use in transmitting test signals from the test probes to the external electronically controlled test analyzer. Such customized wire fixtures are particularly useful in testing circuit boards with complex arrangements of test points and low volume production boards where larger and more complex and expensive electronic test analyzers are not practical.

In addition to customized wired test fixtures, a further class of test fixtures is the so-called grid-type fixture in which translator pins contact random patterns of test points on the board and transfer test signals to interface pins arranged in a grid pattern in a receiver. In this grid type tester, fixturing is generally less complex than in the customized wired test fixtures, but with a grid system, the grid interfaces and test electronics are substantially more complex and costly. The present invention is directed toward the prevention of ESD damage to the more costly grid type fixtures.

A typical grid fixture contains test electronics with a huge number of switching circuits connecting test points in a grid base to corresponding test circuits in the electronic test analyzer. In one embodiment of a grid tester as many as 80,000 test probes are used in top and bottom test fixtures for communicating with complex grid test electronics in which as many as 80,000 corresponding switches are used. During a test cycle in such a grid tester, large probe plates are moved together quickly, compressing the plates together on opposite sides of the UUT. Air rushing away from the probe plates and over the board surfaces can cause a build up of electrostatic charges. Placing the UUT on the fixture also can cause static charges to develop. During testing a large number of metal contact pins on the test probes make sudden contact with switch cards containing expensive integrated circuit modules for the switching circuitry. Such grid fixtures if unprotected for the effects of ESD can suffer costly damage as a result of the build up of such electrostatic charges and a resulting sudden discharge during testing.

The present invention provides a ground plane arrangement for dissipating accumulated charges in a grid tester so that ESD effects are prevented during the test cycle.

SUMMARY OF THE INVENTION

Briefly, one embodiment of the invention comprises a test fixture for providing ESD protection for electronic switching circuitry in a universal grid type test fixture having test probes arranged for electrical contact with a printed circuit board under test, in which test signals are sent between the circuit board and a high speed electronic test analyzer through intervening electronic switching circuits. The test fixture includes a movable probe plate, a test probe mounted on the probe plate, in which the test probe includes a movable plunger for making electrical contact with a printed circuit board during a test cycle, the plunger being movable between a first position and a second position, and a ground plane on the probe plate connected to electrical ground. The probe plunger has a ground plane contact that contacts the ground plane in the first position of the plunger. The ground plane contact moves out of contact with the ground plane when the plunger moves to the second position. The probe plate is movable to a pre-test position in which the plunger is in the first position and in an electrical contact with the circuit board so that electrostatic charges on the board are dissipated to the ground plane via contact between the ground plane contact of the plunger and the ground plane. The probe plate is movable to a test position in which the plunger is compressed under a test force that moves the plunger to the second position out of contact with the ground plane to electrically isolate the plunger for conducting the test of circuits on the board after electrostatic charges have been dissipated. The tests are conducted through electronic signals sent between the board and the high speed electronic test analyzer, communicating with each other through the electronic switching circuits. The electrostatic charges are dissipated for a delay time interval prior to moving the probe to the test position for protecting the switching circuits from ESD damage.

These and other aspects of the invention will be more fully understood by referring to the following detailed description and the accompanying drawings.

DETAILED DESCRIPTION

Figure 1:
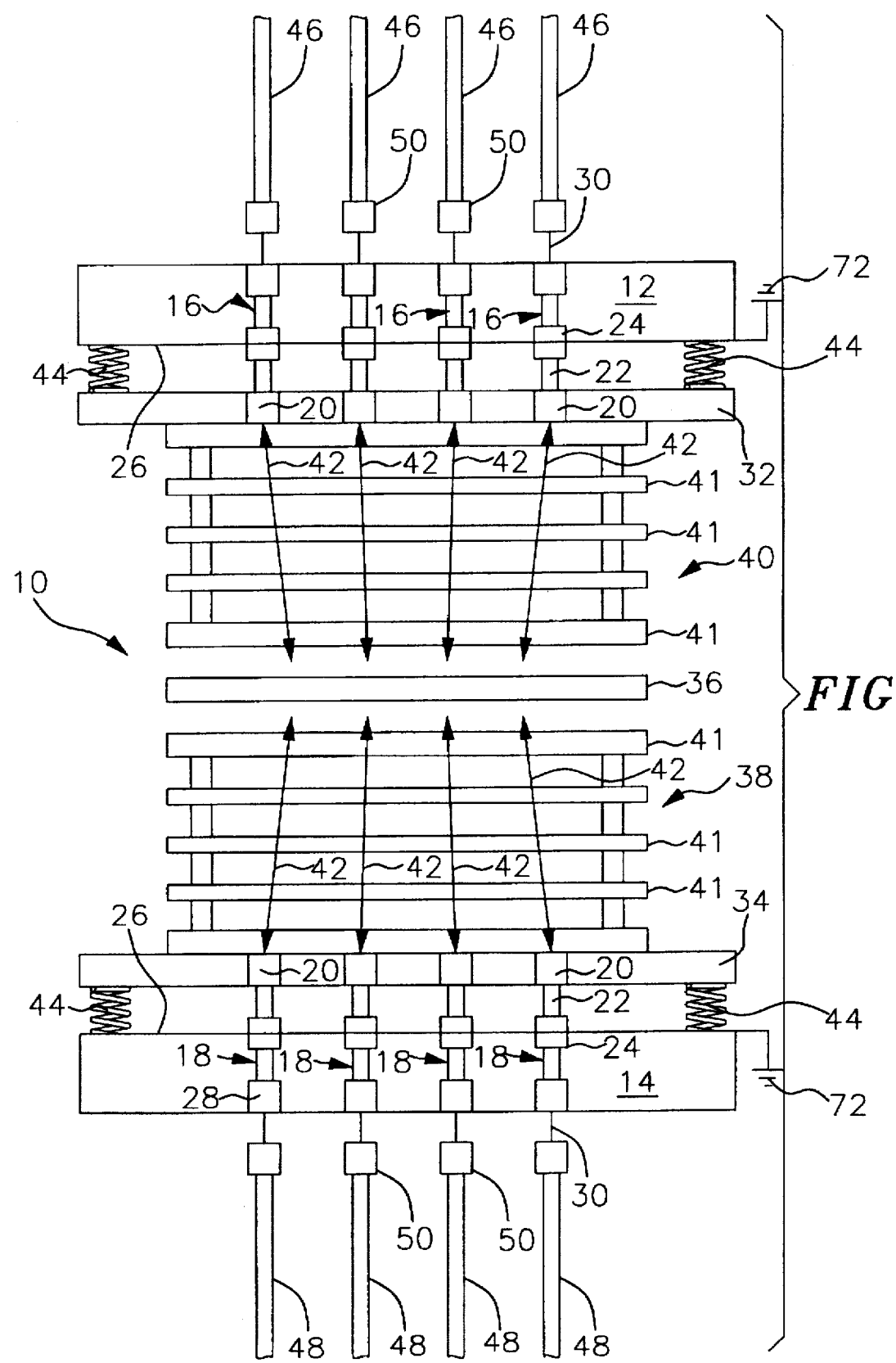
FIG. 1 is a schematic side elevational view showing a universal grid type test fixture of the type that can be protected from ESD damage by a fixturing system of this invention.

FIG. 1 illustrates a universal grid tester 10 having an ESD protection system according to principles of this invention. The grid tester includes upper and lower probe plates 12 and 14 which are spaced apart and extend parallel to one another in a fixturing section of the tester. Each probe plate is made from an electrically insulative material such as G-10 fiberglass. The upper probe plate carries a plurality of upper spring loaded test probes 16 arranged according to principles of this invention. The lower probe plate carries a plurality of lower spring loaded test probes 18 constructed and arranged similar to the upper test probes. The upper and lower test probes are preferably arranged on a grid pattern although other configurations also can be used without departing from the scope of the invention.

The upper and lower test probes are similar in construction, and each includes a receptacle 20 at one end of a spring loaded movable plunger 22, an enlarged ground plane contact 24 on the plunger for making contact with a metal ground plane 26 bonded to a surface of the probe plate, and a fixed barrel 28 with a terminal pin 30. The end portions 20 of the upper and lower test probes extend through corresponding holes drilled in upper and lower stripper plates 32 and 34 made of an electrically insulative material. A printed circuit board 36 or UUT is placed on a lower translator fixture 38 mounted to the lower stripper plate 34. An upper translator fixture 40 secured to the upper stripper plate 32 faces the upper surface of the UUT 36. The upper and lower translator fixtures have parallel support plates 41 that support an array of tilt pins 42 for translating electrical signals between the end portions of the test probes and a pattern of test points in circuits on the upper and lower surfaces of the UUT.

Figure 2:
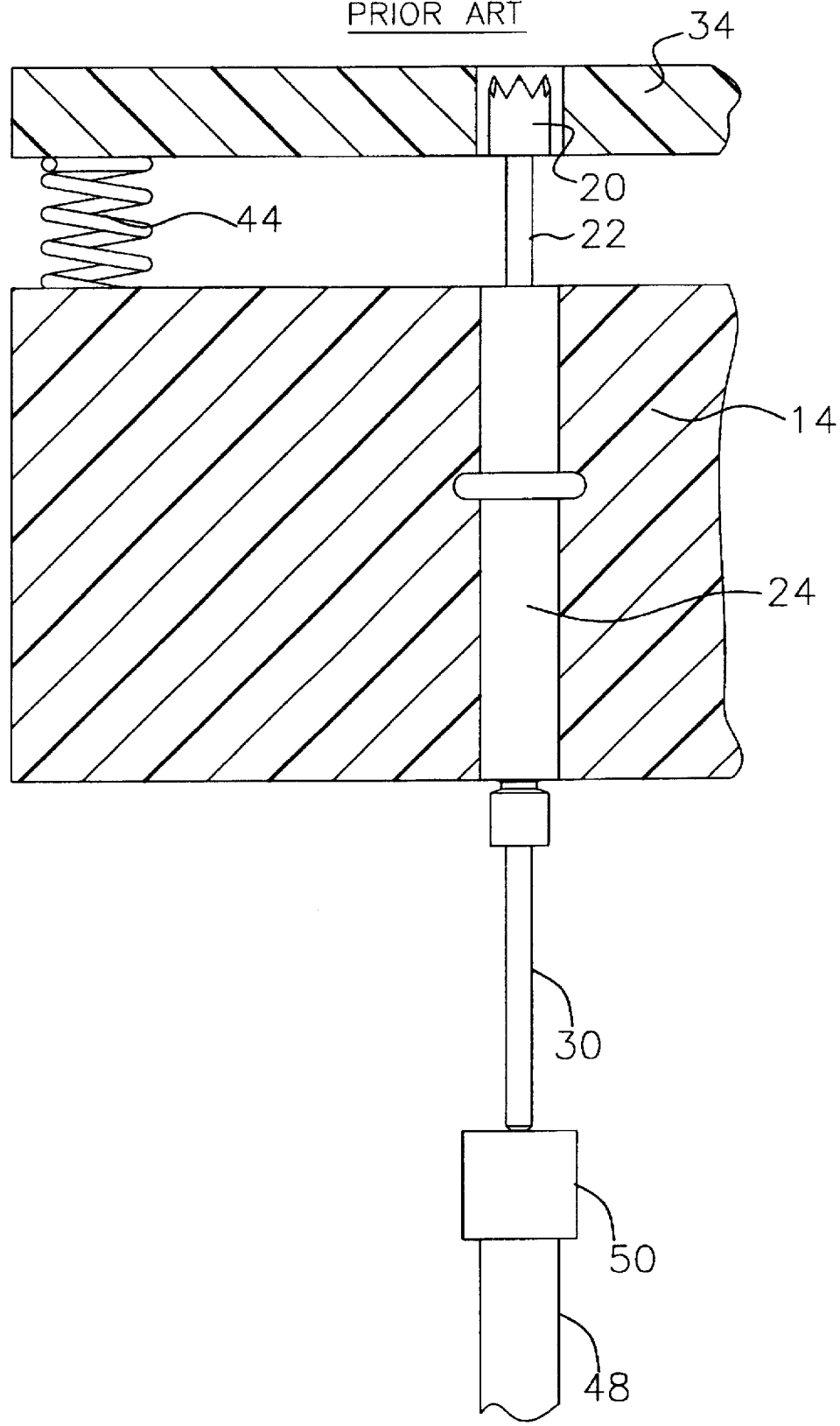
FIG. 2 is a fragmentary side elevational view showing a prior art technique for testing circuit boards in a grid type fixture.

FIG. 2 illustrates a prior art test probe assembly which is an example of an ESD problem overcome by the present invention. During testing, the upper and lower probe plates are forced toward one another rapidly and under extreme pressure to compress the ends of the tilt pins 42 into pressure contact with opposite sides of the UUT. Compression springs 44 between the upper and lower stripper plates and the upper and lower probe plates are compressed under the applied force during testing. The spring loaded plungers 22 in the test probes also are compressed during testing to maintain mechanical compliance on the probes in the test position. The system compliance effectively transmits electronic test signals between the UUT and upper and lower switch cards 46 and 48 which communicate with a high speed electronic test analyzer (not shown). The terminal pins 30 on the upper and lower test probes make pressure contact with contact terminals 50 at the ends of the upper and lower switch cards 46 and 48. The switch cards contain integrated circuit modules and other circuit components necessary to form a complex switching matrix between the UUT and the electronic test analyzer.

When moving the probe plates to the test position their rapid travel under pressure causes air to rush out from the spaces next to both faces of the UUT. The board also can have static charges on it while handling it before it is tested. Further charge build up can occur when placing the board on the test fixture. The air rushing out above and below the circuit board areas charged up with electrostatic potential can cause damage to expensive electronic components in the switching circuits of the tester electronics when the metal plated terminal pins on the probes contact the switch cards during testing. Very expensive testers have been known to suffer severe damage from blown integrated circuit components caused by electrostatic discharges occurring during the test operation.

Figure 3:
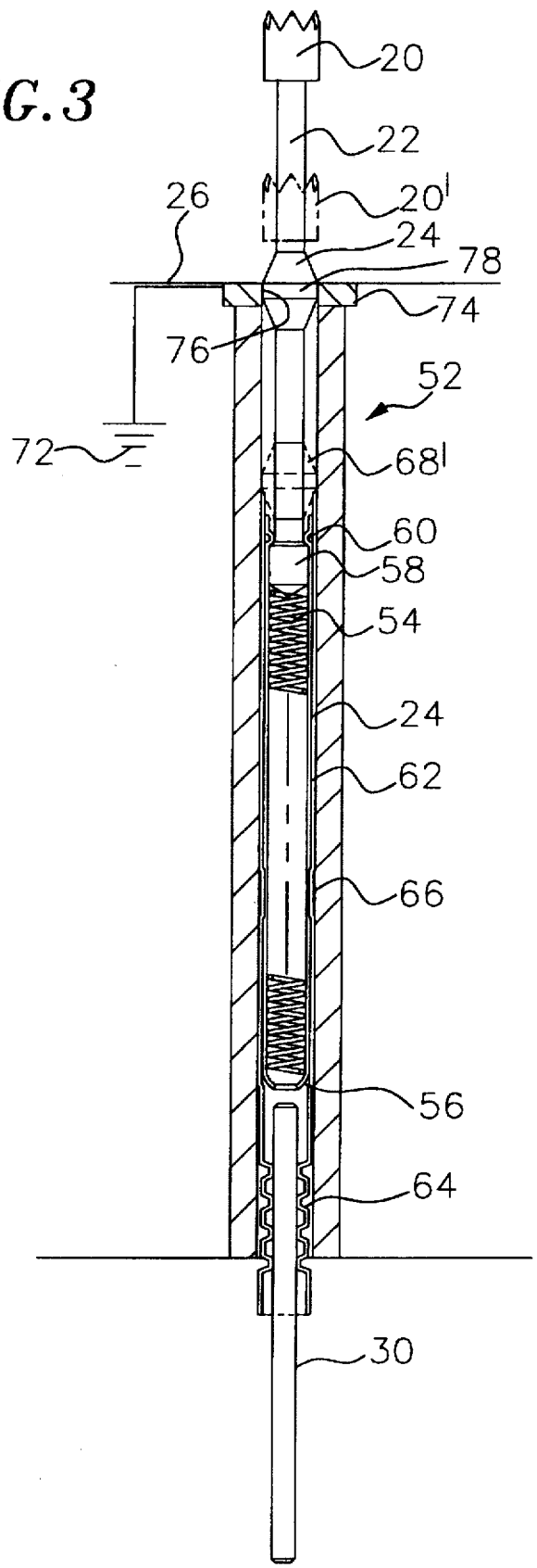
FIG. 3 is a fragmentary side elevational view, partly in cross-section, showing detailed construction of a test probe assembly according to principles of this invention.

FIG. 3 illustrates detailed construction of a test probe assembly 52 according to principles of this invention which provides ESD protection for the test cycle of a circuit board tester, such as the grid tester shown in FIG. 1. In use, all of the test probes in the upper and lower probe plates 12 and 14 are constructed similar to the FIG. 3 probe assembly. As illustrated, the probe assembly includes the electrically conductive plunger 22 which reciprocates in the electrically conductive outer barrel 24. A long compression spring 54 contained in the barrel biases reciprocating travel of the plunger in the barrel. The spring is contained in a lower portion of the barrel extending between a closed end 56 and a contact end engaging an enlarged lower end 58 of the movable plunger. A corresponding crimp 60 in an upper portion of the barrel engages the enlarged lower end 58 of the plunger to retain the plunger in the barrel. A tubular outer receptacle 62 is mounted in a fixed position in the probe plate for containing the barrel and its plunger. A crimped lower end 64 of the receptacle engages the electrically conductive terminal pin 30 which projects away from the probe for contact with the terminal contact 50 on a corresponding switch card in the test switching circuitry. A crimp 66 in the wall of the receptacle applies a crimping force to retain the barrel in the receptacle.

According to principles of this invention, the enlarged ground plane contact section 24 of the plunger is located in a position on the plunger that is normally retained at ground plane level in the probe plate. FIG. 3 illustrates the plunger in its normal pre-test position in which the biasing force of the control spring 54 forces the plunger upwardly, retaining it in a normal position against the stop provided by the enlarged contact 24 engaging the crimp 60.

The electrically conductive ground plane 26 covers the upper face of the probe plate. The ground plane preferably comprises a highly conductive metal such as brass or copper in sheet form bonded to the face of the probe plate. The ground plane is connected externally to electrical ground 72. The drilled holes in the probe plate for containing the probe assemblies include an electrically conductive upper ring 74 electrically connected to the ground plane 26. The plunger in its normal position retains the enlarged contact 24 of the plunger in mechanical and electrical contact with the conductive ring 74, so that in its normal position, the plunger is connected to electrical ground. The conductive ring 74 has a certain thickness with a flat inside diameter wall 76, and the enlarged contact 24 of the plunger has a flat outside diameter wall 78 at its maximum diameter portion 50 that the plunger contact makes sliding contact for a preselected distance along the inside diameter wall 76 of the conductive ring 74.

Figure 4:
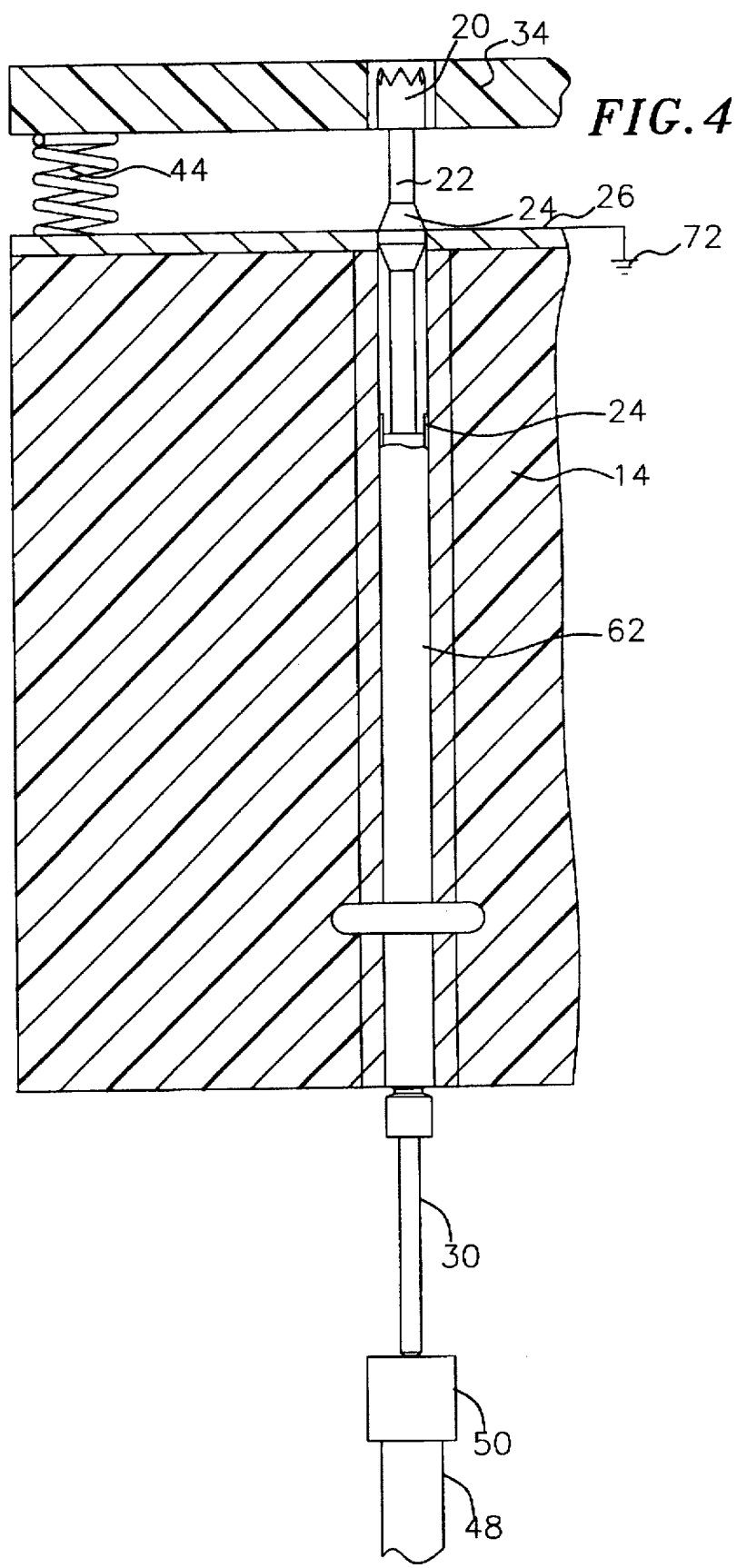
FIG. 4 is a fragmentary side elevational view, partly in cross-section showing a test probe in a grid fixture having ESD protection in which a test probe is shown in a first electrically grounded position.
Figure 5:
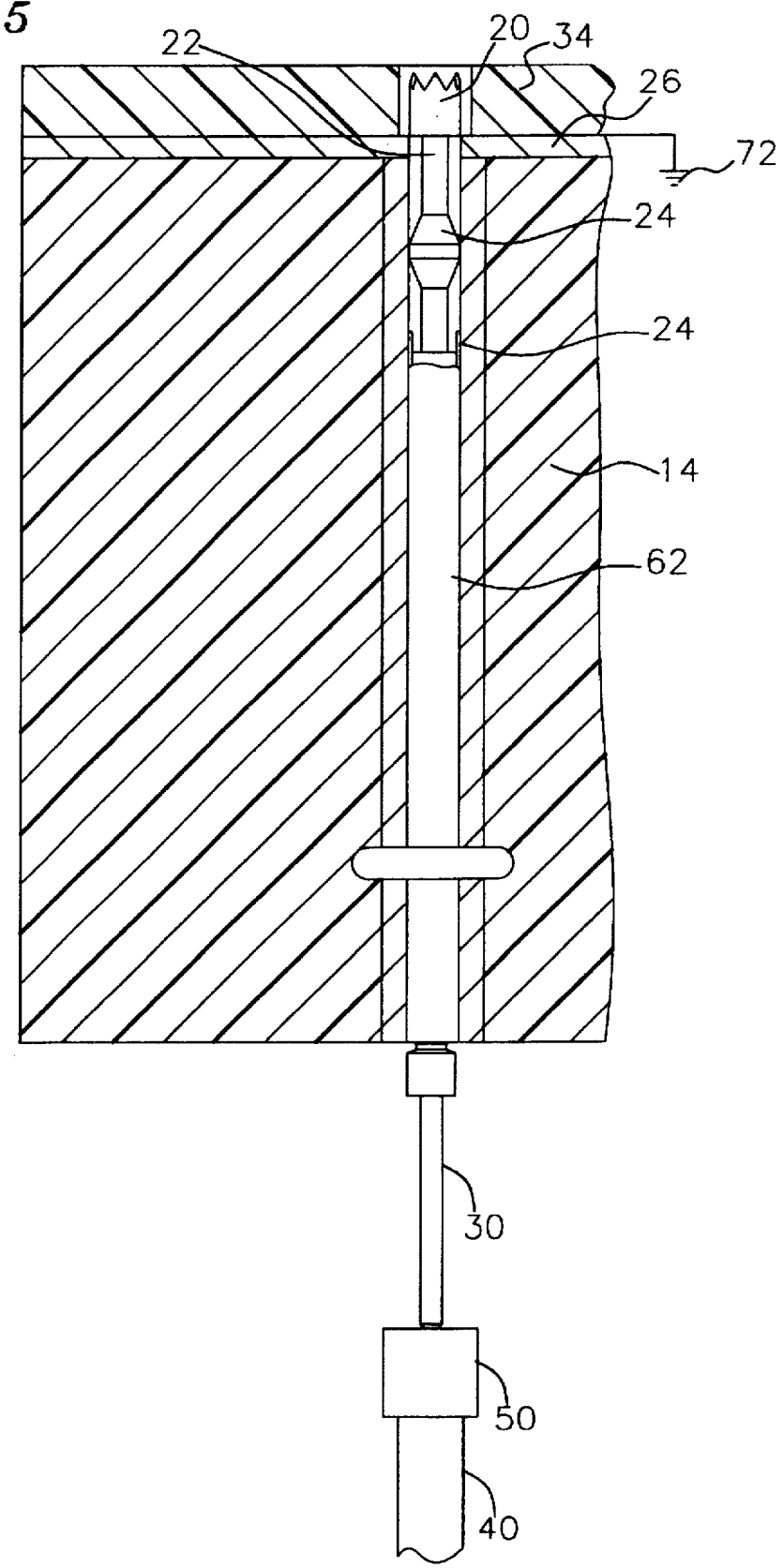
FIG. 5 is a side elevational view of the apparatus shown in FIG. 4 which has moved to an undergrounded position.

FIG. 4 schematically illustrates the position of the test probes in the normal position prior to testing and FIG. 5 illustrates the position of the test probes after they have been moved to the test position. FIG. 3 also illustrates in phantom lines the position of the plunger terminal receptacle 20 and the ground plane contact 68 moved to the test position. The normal pre-test position of the probe is shown in solid lines in FIG. 3. In the normal position shown in FIG. 3, the enlarged ground plane contact 68 of the plunger makes contact with the ground plane. If any static discharge occurs in the normal position of the test probe, the test probe is shorted to ground and no circuit testing can take place. When the test probes are compressed against the circuit board during testing, the plungers move to the position in the barrel shown in FIG. 5 in which the enlarged ground plane contact portion of the plunger is out of contact with the ground plane. In this position, the ground connections of the probes are cut off, and the probes are ready for conducting testing.

During use in a grid test fixture containing the test probes shown in FIGS. 3 through 5, the test operation is carried out with the probes initially in the normal position where if any static charges are present on the board or in the fixture, they are dissipated by shorting to ground through the ground plane connection of the test probes. During a test cycle, the upper and lower probes are moved to a pre-test position, in which the probes are moved into contact with the opposite faces of the board. The probes have not yet been compressed against the board so the probes are maintained in the normal position in which the ground plane contacts of the probes continue to maintain electrical contact with the ground plane. In moving the probe plates to the pre-test position, any static charges produced by air rushing over the surfaces of the circuit board are dissipated to ground. In this pre-test position any electrostatic charges between the terminal pins of the probes and the switch cards also are dissipated to ground. The test cycle will normally involve a delay time of about ½ second so that all static charges can be shorted to ground in the pre-test position before the test probes are compressed against the board. Following the time delay interval, the probe plates are moved so as to compress the test probes against the opposite faces of the board. This causes the plungers of the test probes to move to the position shown in FIG. 5 in which the enlarged ground plane contact portions of the plungers are moved away from electrical contact with the ground plane. In this position the circuit test can be conducted with the test probes being electrically isolated from the ground plane and other electrically conductive elements of the test fixture. Circuit testing on the board is conducted through electronic test signals sent between the board and the high speed electronic test analyzer, communicating through the intervening switching circuits on the switch cards. All electrostatic charges are dissipated during the delay time prior to moving the probe plate to the test position, for protecting the switching circuits from ESD damage.

What is claimed is:

1. A test fixture for providing ESD protection to electronic switching circuitry in a universal grid type test fixture having test probes arranged for electrical contact with a printed circuit board under test, and in which test signals are sent between the circuit board and a high speed electronic test analyzer through intervening switching circuits, test fixture including:

a movable probe plate, a test probe mounted on the probe plate, the test probe including a movable plunger for making electrical contact with a printed circuit board during a test cycle, the plunger being movable between a first position and a second position, a ground plane on the probe plate connected to electrical ground, the probe plunger having a ground plane contact that contacts the ground plane in said first position of the plunger and which moves out of the contact with the ground plane when the plunger moves to the second position, means for moving the probe plate to a pre-test position in which the plunger is in the first position and in electrical contact with the circuit board so that electrostatic charges on the board are dissipated to electrical ground through the ground plane via contact between the ground plane contact of the plunger and the ground plane, and means for moving the probe plate to a test position in which the plunger is compressed under a test force that moves the plunger to the second position out of contact with the ground plane to electrically isolate the plunger for conducting a test of circuits on the board after electrostatic charges have been dissipated through the ground plane.

2. Apparatus according to claim 1, including means for providing a time delay between movement of the probe plate to the pre-test position and movement of the probe plate to the test position, sufficient to provide for dissipation of said electrostatic charges.

3. Apparatus according to claim 1, in which the plunger ground plane contact comprises an enlarged section of the plunger which makes sliding contact with an electrically conductive element in electrical in contact with the ground plane.

4. Apparatus according to claim 3, in which the ground plane comprises a sheet of electrically conductive material carried on a face of the probe plate.

5. A universal grid type test fixture for providing ESD protection to test circuits in the tester, in which the fixture is electrically coupled to a high-speed electronic test analyzer, the tester comprising:

at least one translator fixture having translator pins for contact with a circuit board under test, a movable probe plate, a switch card spaced from the probe plate, the switch card containing a switching circuit communicating with a terminal contact on the switch card, a plurality of test probes mounted in the probe plate, each test probes including a movable plunger for making electrical contact with the translator pin and a terminal pin making contact with the terminal pin of the switch card for transmitting test signals from the printed circuit board to the test analyzer during a test cycle, the plunger being movable between a first position and a second position, a ground plane on the probe plate connected to electrical ground, the probe plunger having a ground plane contact that contacts the ground plane in the first position and which moves out of the contact with the ground plane when the plunger moves to the second position, means for moving the probe plate to a pre-test position in which the plunger is in the first position and in an electrical contact with the printed circuit board so that electrostatic charges on the board are dissipated to electrical ground through the ground plane via contact between the ground plane contact of the plunger and the ground plane, and means for moving the probe plate to a test position in which the plunger is compressed under a test force that moves the plunger to the second position out of contact with the ground plane to electrically isolate the plunger for conducting the test after electrostatic charges have been dissipated through the ground plane.

6. Apparatus according to claim 5, including means for providing a time delay between movement of the probe plate to the pre-test position and movement of the probe plate to the test position, sufficient to provide for dissipation of said electrostatic charges.

* * * * *